(12) United States Patent
Watanabe et al.

(10) Patent No.: US 11,751,444 B2
(45) Date of Patent: Sep. 5, 2023

(54) DISPLAY DEVICE

(71) Applicant: SHARP KABUSHIKI KAISHA, Sakai (JP)

(72) Inventors: Noriko Watanabe, Sakai (JP); Takeshi Yaneda, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 221 days.

(21) Appl. No.: 17/040,383

(22) PCT Filed: Mar. 29, 2018

(86) PCT No.: PCT/JP2018/013258
§ 371 (c)(1),
(2) Date: Sep. 22, 2020

(87) PCT Pub. No.: WO2019/186899
PCT Pub. Date: Oct. 3, 2019

(65) Prior Publication Data
US 2021/0057510 A1    Feb. 25, 2021

(51) Int. Cl.
*H10K 59/131*  (2023.01)
*H10K 50/844*  (2023.01)
(Continued)

(52) U.S. Cl.
CPC ......... *H10K 59/131* (2023.02); *H10K 50/844* (2023.02); *H10K 50/8426* (2023.02); *H10K 59/122* (2023.02); *H10K 2102/311* (2023.02)

(58) Field of Classification Search
CPC ............. H01L 27/3246; H01L 27/3276; H01L 51/5253; H01L 51/5246; H01L 2251/5338; H05B 33/22; H05B 33/02; H05B 33/04; G09F 9/00; G09F 9/30; G09F 9/40; H10K 59/131; H10K 59/122; H10K 50/8426; H10K 50/844; H10K 2102/311

See application file for complete search history.

(56) References Cited

U.S. PATENT DOCUMENTS

2014/0353613 A1* 12/2014 Cheon ................. H10K 50/841
                                                      438/23
2016/0086549 A1*  3/2016 Eom ..................... G06F 3/1423
                                                      345/690

(Continued)

FOREIGN PATENT DOCUMENTS

CN          107527933 A      12/2017
JP          2013-109869 A     6/2013

*Primary Examiner* — Vongsavanh Sengdara
(74) *Attorney, Agent, or Firm* — ScienBiziP, P.C.

(57) ABSTRACT

A flexible display device includes a first display region, a second display region, a curved portion, a first high power supply voltage trunk wiring line, and a second high power supply voltage trunk wiring line. A plurality of first high power supply voltage lines branch from the first high power supply voltage trunk wiring line and extend to the first display region, a plurality of second high power supply voltage lines branch from the second high power supply voltage trunk wiring line and extend to the second display region, and the first high power supply voltage trunk wiring line and the second high power supply voltage trunk wiring line are electrically connected to each other via a first curved portion conductive layer formed in the curved portion.

3 Claims, 10 Drawing Sheets

(51) Int. Cl.
*H10K 50/842* (2023.01)
*H10K 59/122* (2023.01)
*H10K 102/00* (2023.01)

(56) References Cited

U.S. PATENT DOCUMENTS

| | | | |
|---|---|---|---|
| 2016/0203765 A1* | 7/2016 | Lee | G09G 3/3291 |
| | | | 345/76 |
| 2016/0284272 A1* | 9/2016 | Her | G09G 3/035 |
| 2017/0365217 A1* | 12/2017 | An | G09G 3/3258 |
| 2018/0336825 A1 | 11/2018 | An et al. | |

\* cited by examiner

DISPLAY DEVICE

TECHNICAL FIELD

The disclosure relates to a display device.

BACKGROUND ART

A flexible display device has a configuration in which an electro-optical element, together with other circuits or the like that drive the electro-optical element, is sandwiched between a support body that supports these circuits and various function layers.

Such a flexible display device is used as a foldable display device in which a display portion is flexibly deformable, thin, light, and bendable.

Examples of the electro-optical element include an EL element, which is an optical element using electroluminescence (hereinafter referred to as "EL") of a luminescent material. An EL display device using an EL element has attracted attention as a display device having a higher response speed and a wider viewing angle than a liquid crystal display device.

The display device like this includes: a display panel in which a TFT, an optical element such as an organic EL element and a sealing layer covering the optical element are provided on a resin layer (resin film substrate) that is made of polyimide or the like and that includes a barrier layer formed on a surface of the resin layer; and a function film such as a polarizing film or a cover film provided on a surface of the display panel (e.g., see PTL 1).

CITATION LIST

Patent Literature

PTL 1: JP 2013-109869 A (published on Jun. 6, 2013)

SUMMARY

Technical Problem

In a bi-fold flexible display device configured with two spread screens, when a high power supply voltage supplied to a pixel circuit that drives an optical element is applied from both end sides of the spread screens, the voltage decreases and variations in voltage may occur between the high-level power supply voltage lines toward near a central portion.

In light of the foregoing, an object of the disclosure is to provide a display device that suppresses a voltage drop in a high-level power supply voltage and that reduces variation in voltage.

Solution to Problem

To solve the above problem, a display device according to an aspect of the disclosure includes: a first display region and a second display region each including a plurality of optical elements, each of the plurality of optical elements including: a first electrode provided for each pixel; a second electrode provided in common to a plurality of pixels; and a function layer sandwiched between the first electrode and the second electrode; a curved portion provided between the first display region and the second display region; a frame region surrounding the first display region, the second display region, and the curved portion; a terminal portion provided with a terminal of a wiring line; a bending portion provided between the frame region and the terminal portion; a plurality of pixel circuits corresponding to the plurality of optical elements, a plurality of first high power supply voltage lines configured to input a high power supply voltage to the plurality of pixel circuits in the first display region; a plurality of second high power supply voltage lines configured to input a high power supply voltage to the plurality of pixel circuits in the second display region; a first high power supply voltage trunk wiring line provided between the first display region and the second display region; a second high power supply voltage trunk wiring line provided between the first display region and the second display region, where a plurality of the first high power supply voltage lines branch from the first high power supply voltage trunk wiring line and extend to the first display region, a plurality of the second high power supply voltage lines branch from the second high power supply voltage trunk wiring line and extend to the second display region, and the first high power supply voltage trunk wiring line and the second high power supply voltage trunk wiring line are electrically connected to each other via a first curved portion conductive layer formed in the curved portion.

Advantageous Effects of Disclosure

A display device that suppresses a voltage drop in a high-level power supply voltage and that reduces variation in voltage can be provided.

DESCRIPTION OF EMBODIMENTS

First Embodiment

An embodiment of the disclosure will be described below with reference to FIGS. 1 to 7.

Hereinafter, a case where a flexible display device 1 (display device) according to the present embodiment is an organic EL display device including an OLED layer including an organic light emitting diode (OLED) as a light-emitting element (optical element) will be described as an example.

Schematic Configuration of Flexible Display Device

Figure 1:
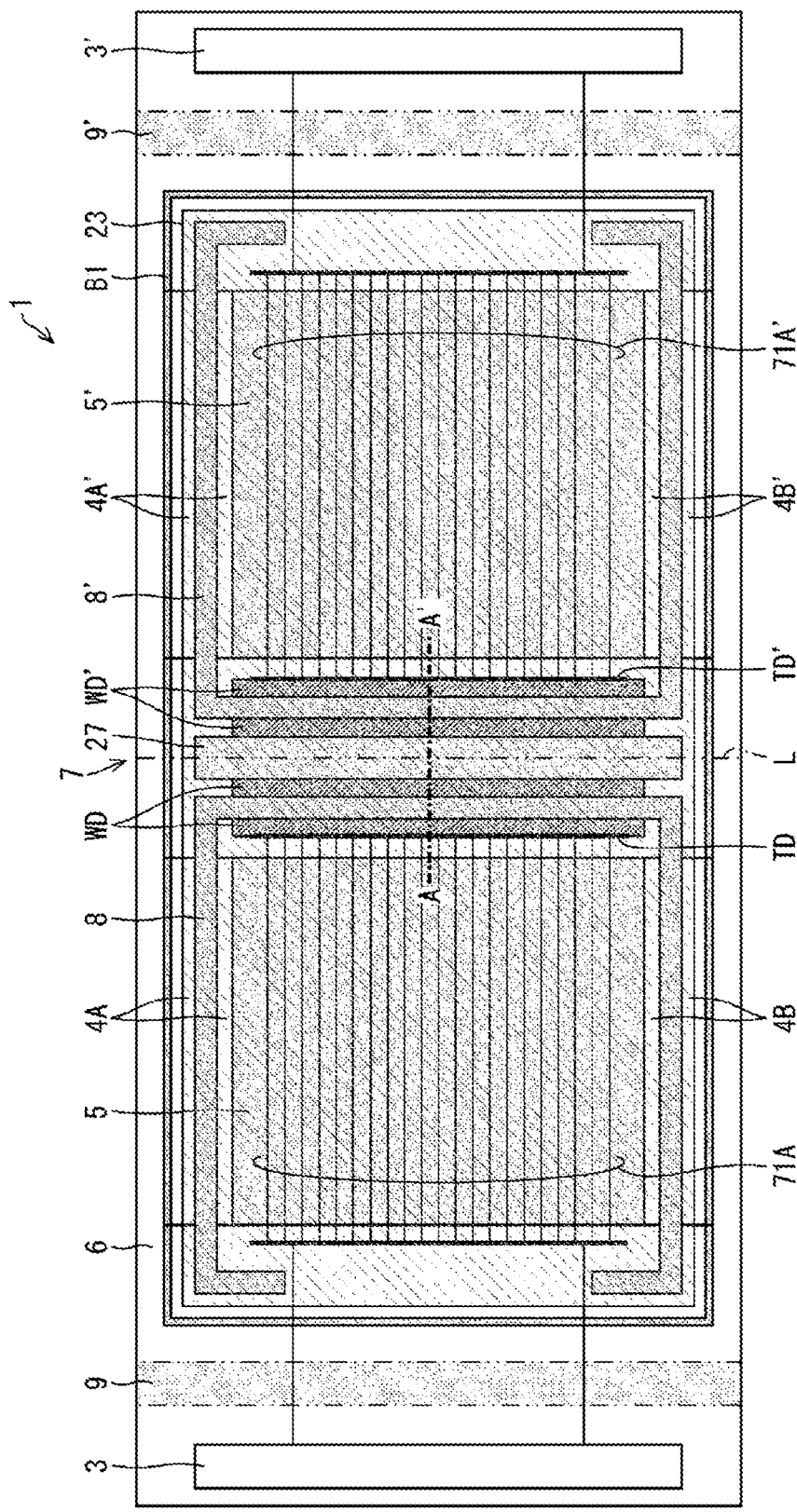
FIG. 1 is a plan view illustrating a schematic configuration of main portions of a flexible display device according to a first embodiment of the disclosure.
Figure 2:
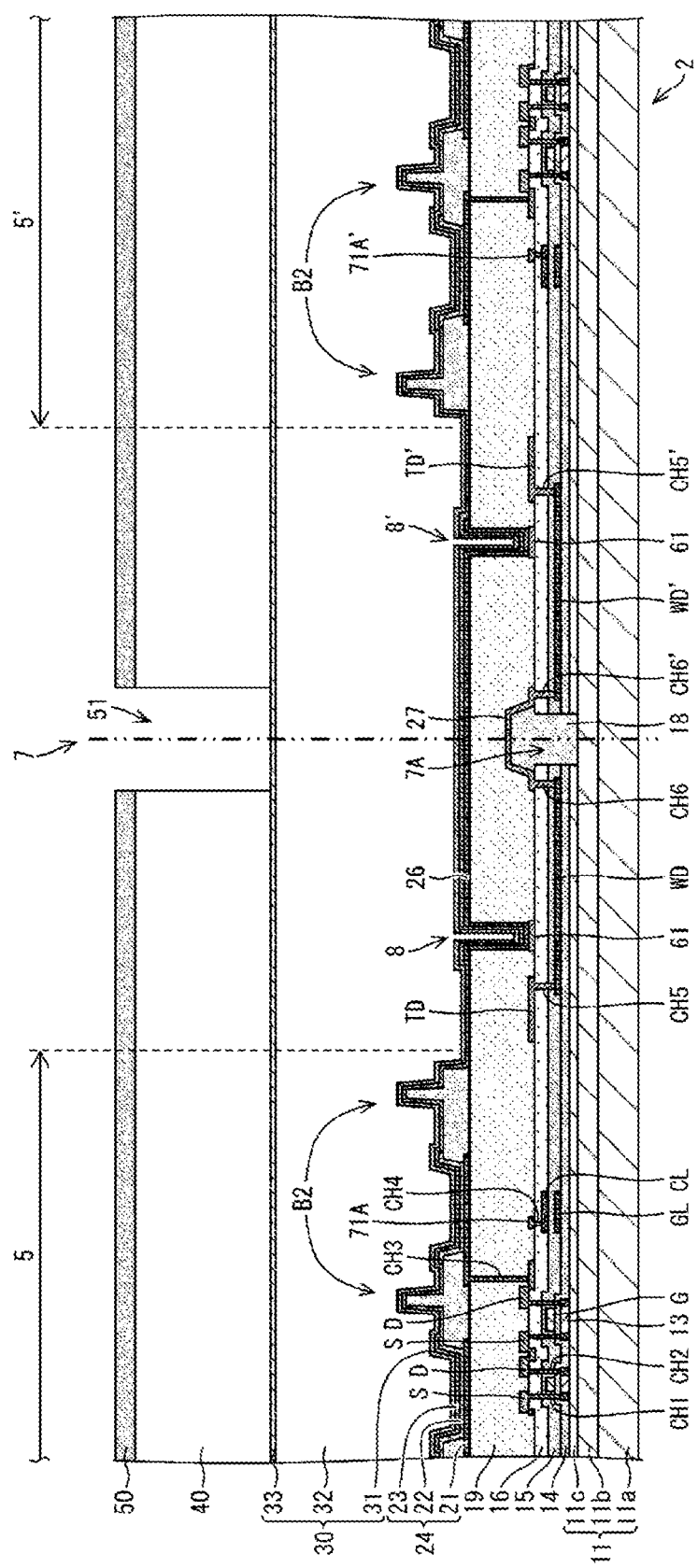
FIG. 2 is a cross-sectional view (taken along line A-A of FIG. 1) illustrating a schematic configuration at or near a curved portion of a flexible display device according to the first embodiment of the disclosure.

FIG. 1 is a plan view illustrating a schematic configuration of main portions of the flexible display device 1 according to the present embodiment. FIG. 2 is a cross-sectional view illustrating a schematic configuration at or near a curved portion 7 of the flexible display device 1 according to the present embodiment. Further, FIG. 2 corresponds to a cross-sectional view taken along line A-A of the flexible display device 1 illustrated in FIG. 1.

The flexible display device 1 is a folding type flexible image display device (foldable display) provided so as to be foldable (bendable) and expandable (extendable). Here, the "expanded state" refers to a state in which the flexible display device 1 is in a state of 180-degree expansion, in other words, refers to a so-called fully flat state in which the flexible display device 1 is made to be flat by being opened.

Hereinafter, a case in which the flexible display device 1 is a bi-fold rectangular display device including two spread screens will be described as an example.

As illustrated in FIG. 1, in a plan view, the flexible display device 1 includes: a first display region 5 (hereinafter simply referred to as "display region 5") and a second display region 5' (hereinafter simply referred to as "display region 5'") constituting each of two spread screens; a curved portion 7 provided between the display region 5 and the display region 5'; a frame region 6 as a peripheral region surrounding the display regions 5, 5' and the curved portion 7; GDMs (Gate Driver Monolithic) 4A, 4B, 4A', and 4B' formed in the frame region 6; terminal portions 3 and 3' in which terminals of the respective wiring lines are formed; and bending portions 9 and 9' provided between the frame region 6 and the terminal portions 3, 3'. The term "plan view" refers to, for example, a view of an OLED panel 2 from the upper face side thereof.

The curved portion 7 is a portion that bends the flexible display device 1 and is provided along a line L that connects a central portion of each side along the longitudinal direction of the flexible display device 1. The flexible display device 1 has a line-symmetric structure with the line L as an axis.

In the frame region 6, a first trench (depression, recess) 8 (hereinafter, simply referred to as a "trench 8") is formed so as to surround the display region 5 and not to straddle the curved portion 7. Moreover, a second trench 8' (hereinafter, simply referred to as a "trench 8'") is formed so as to surround the display region 5' and not to straddle the curved portion 7.

In addition, in the frame region 6, a frame-shaped bank (wall body, bank) B1 straddling the curved portion 7 is formed so as to surround the display regions 5, 5' and the trenches 8, 8'.

The terminal portions 3 and 3' are formed so as not to overlap the bending portions 9 and 9' in the frame region 6 between the display regions 5, 5' and the edge portion of the OLED panel 2. The terminal portions 3 and 3' are bonded to a flexible printed circuit (FPC) substrate by an anisotropic conductive film (ACF). The terminal portions 3 and 3' input each signal or reference potential supplied from the display control circuit to the pixel circuit 25.

Pixel Circuit 25

Figure 3:
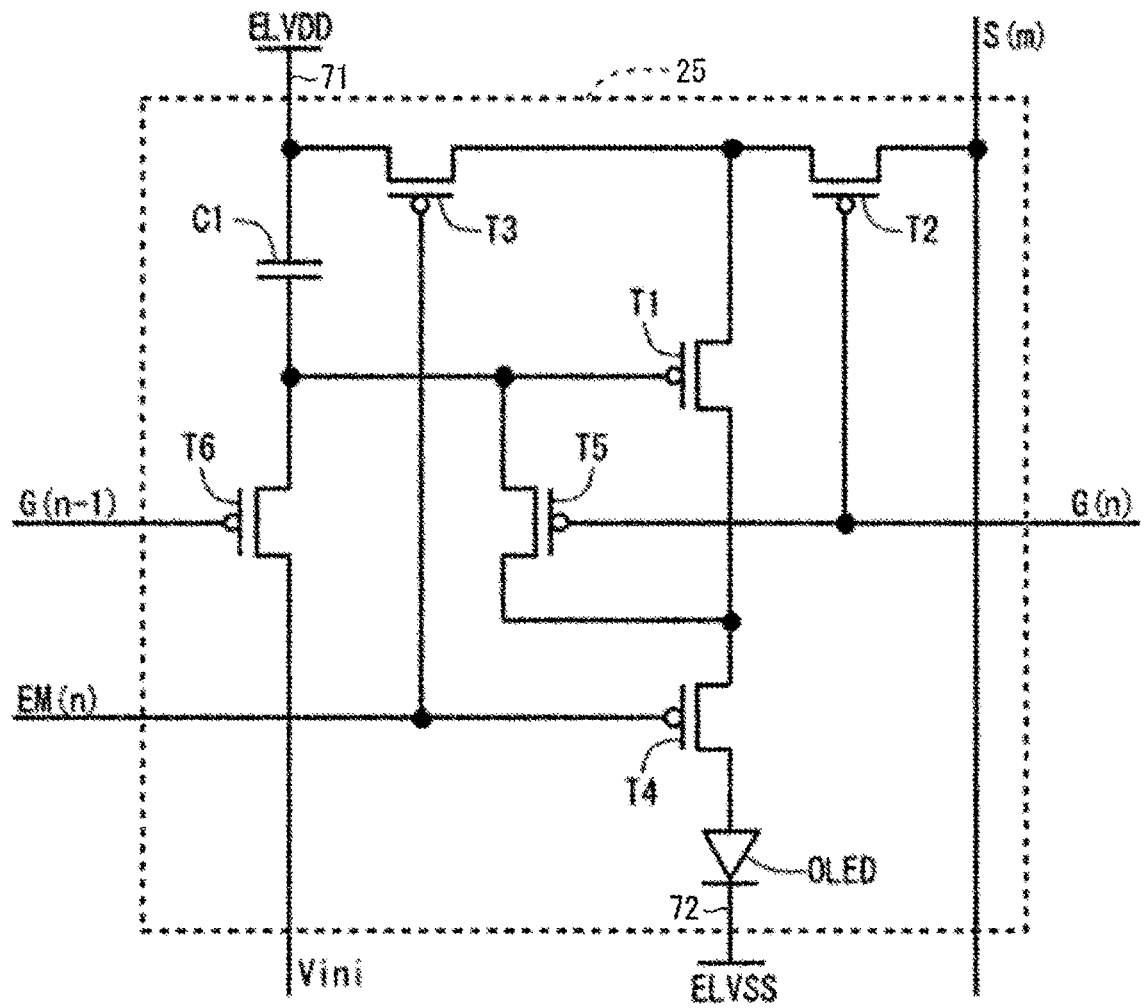
FIG. 3 is a circuit diagram illustrating a configuration of a pixel circuit of a flexible display device according to each embodiment of the disclosure.

The configuration of the pixel circuit 25 formed in the display regions 5 and 5' will be described with reference to FIG. 3. FIG. 3 is a circuit diagram illustrating a configuration of one of the pixel circuits 25 corresponding to m columns and n rows (m and n are natural numbers of one or more). The configuration of the pixel circuit 25 described here is an example, and other known configurations may be also adopted.

The display regions 5 and 5' are provided with a plurality of scanning signal lines GL(n), and a plurality of data signal lines SL(m) orthogonal to the plurality of scanning signal lines GL(n). In addition, in the display regions 5 and 5', a plurality of light emission control lines EM(n), which correspond one-to-one to the scanning signal lines GL(n) and extend in parallel with the scanning signal lines GL(n), are provided. The light emission control line EM(n) controls the emission/non-emission timing of each OLED 24.

In the display regions 5 and 5', a pixel circuit 25 (subpixel circuit) for driving the OLED 24 is provided so as to correspond to each of intersections of the plurality of scanning signal lines GL(n) and the plurality of data signal lines SL(m). By providing the pixel circuits 25 in this manner, a plurality of pixel matrices are formed in the display regions 5 and 5'. A region partitioned by the scanning signal line GL(n) and the data signal line SL(m) is a pixel 90, and one picture element is formed by a set of pixels 90 of respective colors (e.g., red (R), blue (B), and green (B)).

Additionally, a power source line common to respective pixel circuits 25 is provided in the display regions 5 and 5'. More specifically, a plurality of high-level power supply voltage lines 71 (solid wiring common to a plurality of pixel circuits 25) that supply a high-level power supply voltage (ELVDD) for driving the OLED 24, a plurality of low-level power supply voltage lines 72 that supply a low-level power supply voltage (ELVSS) for driving the OLED 24, and a power source line for supplying an initialization voltage Vini are provided. The high-level power supply voltage, the low-level power supply voltage, and the initialization voltage Vini are supplied from a power source circuit (not illustrated).

The pixel circuit 25 includes one OLED 24 and six transistors T1 to T6 (driving transistor T1, writing control transistor T2, power supply control transistor T3, light emission control transistor T4, threshold voltage compensation transistor T5, initialization transistor T6) (simply referred to as "TFT" hereafter) and one capacitor C1. The transistors T1 to T6 are p-channel transistors. The capacitor C1 is a capacitance element including two electrodes (first electrode and second electrode). The pixel circuit 25 illustrated in FIG. 3 is an example and may include an n-channel transistor.

The scanning signal line GL(n) and the light emission control line EM(n) are each connected to a gate driver, and the data signal line SL(m) is connected to a source driver. The gate driver drives the scanning signal line GL(n) and the light emission control line EM(n) based on a control signal such as a clock signal received from the display control circuit. The source driver drives the data signal line SL(m) in accordance with a control signal input from the display control circuit.

The pixel circuit 25 selects a pixel 90 to which a signal is input through the scanning signal line GL(n), determines the amount of charge to be input to the selected pixel 90 through the data signal line SL, and supplies a high-level potential from the high-level power supply voltage line 71 to OLED 24, while a low-level potential is supplied from the low-level power supply voltage line 72 to OLED 24.

The display control circuit includes an input connector, a timing controller, a power source IC (integrated circuit), or the like, and supplies timing signals such as a gate start pulse signal and a gate clock signal, a power source, an address designation signal or the like, if necessary, to the gate driver, and supplies timing signals such as a source start pulse signal, a source clock signal, and a polarity inversion signal, and gray scale data, a power source, or the like to the source driver.

The gate driver and the source driver may each be formed by one IC chip, or may include a plurality of gate drivers or source drivers each formed by one IC chip. An IC chip including a source driver may include a structure of a gate driver or part of a display control circuit.

In the present specification, the plurality of scanning signal lines GL(n) are simply referred to as "scanning signal lines GL" when they are not distinguished from each other, the plurality of data signal lines SL(m) are simply referred to as "data signal lines SL" when they are not distinguished from each other, and the plurality of light emission control lines EM(n) are simply referred to as "light emission control lines EM" when they are not distinguished from each other.

OLED Panel 2

As illustrated in FIG. 2, the OLED panel 2 has a configuration in which an OLED layer 20 constituting the OLED 24, a sealing film 30, and a cover layer 50 are provided on a TFT (Thin Film Transistor) substrate 10 in this order from the TFT substrate 10 side.

TFT Substrate 10

The TFT substrate 10 includes an insulating support body 11 and a TFT layer 12 provided on the support body 11.

Support Body 11

The support body 11 is a flexible layered film including a resin layer 11b, a barrier layer 11c (moisture-proof layer) provided on the resin layer 11b, and a underlayer film 11a provided on a surface of the resin layer 11b opposite to the barrier layer 11c via an adhesive layer.

In the following description, the underlayer film 11a side of the support body 11 is referred to as the lower side, and the cover layer 50 side is referred to as the upper side.

Examples of the resins used for the resin layer 11b include polyimide, polyethylene, and polyamide, or the like. The resin layer 11b may be replaced with two resin films (e.g., polyimide films) and an inorganic insulating film sandwiched therebetween.

The barrier layer 11c is a layer that prevents moisture and impurities from reaching the TFT layer 12 and the OLED layer 20 formed on the support body 11, and can be formed of, for example, a silicon oxide (SiOx) film, a silicon nitride (SiNx) film, a layered film thereof, or the like formed by a CVD method.

The barrier layer 11c is provided over the entire surface of the resin layer 11b so that the surface of the resin layer 11b is not exposed. Thus, even when resins such as polyimide, which are weak to chemical solution, are used as the resin layer 11b, elution of the resins and process contamination due to the chemical solution can be prevented.

The underlayer film 11a is attached to the lower face of the resin layer 11b from which a carrier substrate such as a glass substrate used for manufacturing the OLED panel 2 has been peeled off, which aims at manufacturing the flexible display device 1 that has sufficient strength even when the resin layer 11b is very thin. As the underlayer film 11a, for example, plastic films made of flexible resins, such as polyethyleneterephthalate, polyethylenenaphthalate, cycloolefin polymer, polyimide, polycarbonate, polyethylene, and aramid, are used.

TFT Layer 12

The TFT layer 12 has a configuration in which a semiconductor layer 13, a layered film 17 (hereinafter, simply referred to as a "layered film 17") in which an inorganic insulating layer and a wiring line layer are repeatedly layered, and an organic insulating film 19 used as a flattening film for flattening a surface of the layered film 17 are provided in this order from below (i.e., from the support body 11 side).

The organic insulating film 19 may be made of, for example, a coatable organic material such as polyimide or acrylic. As described above, the trench 8 is formed in the organic insulating film 19 so as to surround the display region 5, and similarly, the trench 8' is formed so as to surround the display region 5'.

The semiconductor layer 13 is made of, for example, low-temperature polysilicon (LTPS) or an oxide semiconductor (e.g., In—Ga—Zn—O based semiconductor), and is formed in a plurality of island shapes.

The layered film 17 includes a plurality of inorganic insulating layers and a plurality of wiring line layers, and has a structure in which a plurality of inorganic insulating layers and a plurality of wiring line layers are alternately layered. The inorganic insulating layer includes the gate insulating film 14 and the inorganic insulating films 15 and 16, and can be configured by, for example, a silicon oxide (SiOx) film, a silicon nitride (SiNx) film, or a layered film thereof formed by a CVD method. The wiring line layer includes a first metal layer, a second metal layer, and a third metal layer.

The first metal layer includes at least, a plurality of gate electrodes G, a plurality of scanning signal lines GL connected to the plurality of gate electrodes G, and a plurality of light emission control lines EM. The second metal layer includes at least a plurality of capacitance wiring lines CL. The third metal layer includes at least a plurality of source electrodes S, a plurality of data signal lines SL connected to the plurality of source electrodes S, a plurality of drain electrodes D, a plurality of high-level power supply voltage lines 71, and a plurality of low-level power supply voltage lines 72.

A gate insulating film 14 is formed on the support body 11 so as to cover the semiconductor layer 13 formed on the support body 11. A first metal layer is formed on the gate insulating film 14. The first metal layer is covered with an inorganic insulating film 15, and a second metal layer is formed on the inorganic insulating film 15. Further, an inorganic insulating film 16 is formed on the inorganic insulating film 15 so as to cover the second metal layer, and a third metal layer is formed on the inorganic insulating film 16.

The semiconductor layer 13, the gate electrode G, the inorganic insulating films 15 and 16, the source electrode S, and the drain electrode D constitute a TFT. In the present embodiment, the case where the TFT has a top gate structure having the semiconductor layer 13 as a channel is illustrated as an example, but the TFT may have a bottom gate structure.

The source electrode S is connected to the semiconductor layer 13 via a contact hole CH1 provided in the gate insulating film 14 and the inorganic insulating films 15 and 16. The drain electrode D is connected to the semiconductor layer 13 via a contact hole CH2 provided in the gate insulating film 14 and the inorganic insulating films 15 and 16.

The source electrode S is connected to the data signal line SL. The drain electrode D is connected to the first electrode 21 (anode electrode) of the OLED 24 via a contact hole CH3 penetrating the organic insulating film 19. The capacitance wiring line CL is connected to the high-level power supply voltage line 71 via a contact hole CH4 provided in the inorganic insulating film 16.

The high-level power supply voltage line 71 is connected to the high-level power supply circuit portion. The low-level power supply voltage line 72 is connected to a low-level power supply circuit portion.

The high-level power supply voltage line 71 is applied with a high-level potential voltage higher than the low-level potential voltage applied to the second electrode 23 (cathode electrode) of the OLED 24 in order to supply a drive current (light emission current) to the first electrode 21 of the OLED 24 according to the display data.

The high-level power supply voltage line 71 supplies the high-level potential supplied from the high-level power supply circuit portion to each OLED 24. The low-level power supply voltage line 72 supplies the low-level potential supplied from the low-level power supply circuit portion to each OLED 24. Note that the high-level potential and the low-level potential are respectively constant potentials.

Each of the first high-level power supply voltage line 71A (first high power supply voltage line) that supplies the high-level potential to the pixel circuit 25 in the display region 5 is connected to the first high power supply voltage trunk wiring line TD. In other words, the plurality of first high-level power supply voltage lines 71A branch from the first high power supply voltage trunk wiring line TD and extend to the display region 5. The first high power supply voltage trunk wiring line TD is provided between the display region 5 and the curved portion 7 along the curved portion 7 in the third metal layer.

Similarly, each of the second high-level power supply voltage line 71A' (second high power supply voltage line) that supplies the high-level potential to the pixel circuit 25 in the display region 5' is connected to the second high power supply voltage trunk wiring line TD'. In other words, the plurality of second high-level power supply voltage lines 71A' branch from the second high power supply voltage trunk wiring line TD' and extend to the display region 5'. The second high power supply voltage trunk wiring line TD' is provided between the display region 5' and the curved portion 7 along the curved portion 7 in the third metal layer.

The first high power supply voltage trunk wiring line TD is connected to the first high power supply lead wiring line WD formed in the first metal layer via the contact hole CH5 provided on the display region 5 side of the trench 8. The first high power supply lead wiring line WD is connected to the first curved portion conductive layer 27 formed in the curved portion 7 via the contact hole CH6 provided near the curved portion 7. That is, the first high power supply lead wiring line WD straddles the lower side of the trench 8, and the trench 8 overlaps the first high power supply lead wiring line WD via at least one inorganic film forming the TFT layer 12.

Note that in FIG. 1, although not illustrated, a plurality or solid-like first high power supply lead wiring line WD is formed in a region labeled "WD".

The first high power supply lead wiring line WD may also be formed in the second metal layer. The first high power supply lead wiring line WD may be formed in the third metal layer between the trench 8 and the curved portion 7.

Similarly, the second high power supply voltage trunk wiring line TD' is connected to the second high power supply lead wiring line WD' formed in the first metal layer via the contact hole CH5' provided on the display region 5' side of the trench 8'. The second high power supply lead wiring line WD' is connected to the first curved portion conductive layer 27 via a contact hole CH6' provided near the curved portion 7. That is, the second high power supply lead wiring line WD' straddles the lower side of the trench 8', and the trench 8' overlaps the second high power supply lead wiring line WD' via at least one inorganic film forming the TFT layer 12.

Note that in FIG. 1, although not illustrated, a plurality or solid-like first high power supply lead wiring line WD' is formed in a region labeled "WD'".

Furthermore, the second high power supply lead wiring line WD' may be formed in the second metal layer. Additionally, a second high power supply lead wiring line WD' may be formed in the third metal layer between the trench 8' and the curved portion 7.

As described above, the first high power supply lead wiring line WD is connected to the first curved portion conductive layer 27, and the second high power supply lead wiring line WD' is connected to the first curved portion conductive layer 27, and thus the first high power supply voltage trunk wiring line TD and the second high power supply voltage trunk wiring line TD' are electrically connected via the first curved portion conductive layer 27.

In the curved portion 7, an opening 7A is formed by removing at least one of the inorganic films (the gate insulating film 14, the inorganic insulating films 15 and 16) forming the TFT layer 12, and a filling film is formed so as to fill the opening 7A with the flattening film 18. The first curved portion conductive layer 27 is formed, on the filling film, of the same material in the same layer as the third metal layer. The first curved portion conductive layer 27 may be solid-like or may be divided into a plurality of portions.

In the bending portions 9 and 9', as in the curved portion 7, at least one of the inorganic films (the gate insulating film 14, the inorganic insulating films 15 and 16) forming the TFT layer 12 is removed to form an opening 9A, and a filling film is formed to fill the opening 9A with the flattening film 18.

OLED Layer 20

The OLED layer 20 includes a first electrode 21, an organic EL layer 22 that is formed on the first electrode 21 and that includes an organic layer (function layer) including at least a light-emitting layer, a second electrode 23 formed on the organic EL layer 22, and banks B1 and B2.

The first electrode 21, the organic EL layer 22, and the second electrode 23 constitute a pixel circuit that forms the OLED 24 constituting each pixel 90. In the present embodiment, layers between the first electrode 21 and the second electrode 23 are collectively referred to as organic EL layers 22.

On the second electrode 23, an optical adjustment layer for performing optical adjustment and a protection layer for protecting the second electrode 23 and preventing oxygen and moisture from entering the OLED 24 from the outside may be formed. In the present embodiment, the organic EL layer 22 formed in each pixel 90, the pair of electrode layers (the first electrode 21 and the second electrode 23) sandwiching the organic EL layer 22, and the optical adjustment layer and the protection layer formed as necessary are collectively referred to as the OLED 24.

The first electrode 21 injects (supplies) holes into the organic EL layer 22, and the second electrode 23 injects electrons into the organic EL layer 22. The holes and electrons injected into the organic EL layer 22 are recombined in the organic EL layer 22 to form excitons. The formed excitons emit light when they are deactivated from excited states to ground states, and the emitted light is emitted from the OLED 24 to the outside.

The first electrode 21 is electrically connected to the TFT via a contact hole formed in the organic insulating film 19.

The first electrode 21 is a pattern electrode formed in an island shape for each pixel 90, and is formed, for example, in a matrix shape. On the other hand, the second electrode 23 is a solid-like common electrode common to the pixels 90 in the display regions 5 and 5', and straddles the curved portion 7 in a plan view.

In the trenches 8 and 8', the second electrode 23 is in contact with the intermediate conductive film 26 formed of the same material in the same layer as the first electrode 21. Further, as illustrated in FIG. 2, in the section between the trench 8 and the trench 8', the second electrode 23 and the intermediate conductive film 26 may be extended while being in contact with each other. That is, the intermediate conductive film 26 may be provided straddling the curved portion 7. As illustrated in FIG. 2, a wiring line 61 formed of the same material in the same layer as the third metal layer may be provided below the trenches 8 and 8'.

In the case where the flexible display device 1 is a top emission type that emits light from the sealing film 30 side, it is preferable that the first electrode 21 be formed of a reflective electrode material formed by layering ITO (Indium Tin Oxide) and Ag (silver) or an alloy containing Ag, and the second electrode 23 be formed of a transparent electrode material such as an MgAg alloy (ultrathin film), ITO, or IZO (Indium zinc Oxide). Each of the first electrode 21 and the second electrode 23 may be a single layer or may have a layered structure. For example, when the OLED 24 is a top emission type OLED, the first electrode 21 may have a layered structure of a reflective electrode and a transparent electrode.

The bank B1 is an organic layer stopper that defines the edge of the organic layer 32 by blocking the liquid organic material used for the organic layer 32 (in other words, blocking the organic layer 32). The liquid organic material used for the organic layer 32 is likely to stay on the flat portion of the upper face of the bank B1 and is blocked by the flat portion. Therefore, the edge of the organic layer 32 overlaps the upper face (top face) of the bank B1, and the organic layer 32 does not exist outside the frame-shaped bank B1.

The bank B2 functions as an edge cover that prevents electrode concentration and a short circuit with the second electrode 23 due to thinning of the organic EL layer 22 at the peripheral portion of the first electrode 21, and also functions as a pixel separation layer that separates the pixels 90 so that current does not leak to the adjacent pixels 90.

Sealing Film 30

The sealing film 30 is transparent and includes a plurality of inorganic layers arranged to overlap each other and at least one organic layer sandwiched between the plurality of inorganic layers. For example, the sealing film 30 includes a first inorganic layer 31, an organic layer 32, and a second inorganic layer 33, which are layered in this order from the TFT substrate 10 side.

Each of the first inorganic layer 31 and the second inorganic layer 33 is an inorganic insulating film, and can be composed of, for example, a silicon oxide film, a silicon nitride film, a silicon oxynitride film, or a layered film thereof, which are formed by a CVD method. They have a moisture-proof function to prevent moisture from entering and functions as a barrier layer to prevent deterioration of the OLED 24 due to moisture and oxygen.

The organic layer 32 is a transparent organic film and can be made of a coatable organic material such as acrylic. The organic layer 32 is used as a buffer layer (stress relief layer) to relieve the stress of the first inorganic layer 31 and the second inorganic layer 33 having a large film stress, to flatten the surface of the OLED layer 20 in the display regions 5 and 5' by filling a step portion or a foreign matter, to fill a pinhole, and to flatten the underlayer of the second inorganic layer 33, thereby suppressing the generation of cracks in the second inorganic layer 33 when the second inorganic layer 33 is layered.

Each of the first inorganic layer 31 and the second inorganic layer 33 can be composed of, for example, a silicon oxide film, a silicon nitride film, a silicon oxynitride film, or a layered film thereof, which are formed by CVD.

The organic layer 32 is a transparent organic insulating film thicker than the first inorganic layer 31 and the second inorganic layer 33. The organic layer 32 is formed by, for example, applying a liquid organic material onto the first inorganic layer 31 in the display regions 5 and 5' by an ink-jet method or the like, and by curing the liquid organic material. Examples of the organic material include photosensitive resins such as acrylic resins, epoxy resins, and silicone resins. The organic layer 32 can be formed by, for example, applying an ink containing such a photosensitive resin as a liquid organic material onto the first inorganic layer 31 by ink-jet coating and then curing the ink by UV (ultraviolet ray).

Cover Layer 50

A cover layer 50 is provided on the sealing film 30 via an adhesive layer 40. In the present embodiment, a notch portion 51 is provided in the cover layer 50 and the adhesive layer 40 in the curved portion 7, as illustrated in FIG. 2.

Furthermore, the cover layer 50 may be provided so as to avoid the curved portion 7. The cover layer 50 may be provided without avoiding the curved portion 7 in order to protect the flexible display device 1, provided that there is no cracking (in particular, cracking of the inorganic insulating film) due to stress in the curved portion 7.

The cover layer 50 includes a function film layer having at least one of a protection function, an optical compensation function, and a touch sensor function. The cover layer 50 may be a protection film that functions as a support body when a carrier substrate such as a glass substrate is peeled off, and may be a hard coat layer such as a hard coat film, or a function film such as a polarizing film and a touch sensor film.

Example of Manufacturing Process

Figure 4:
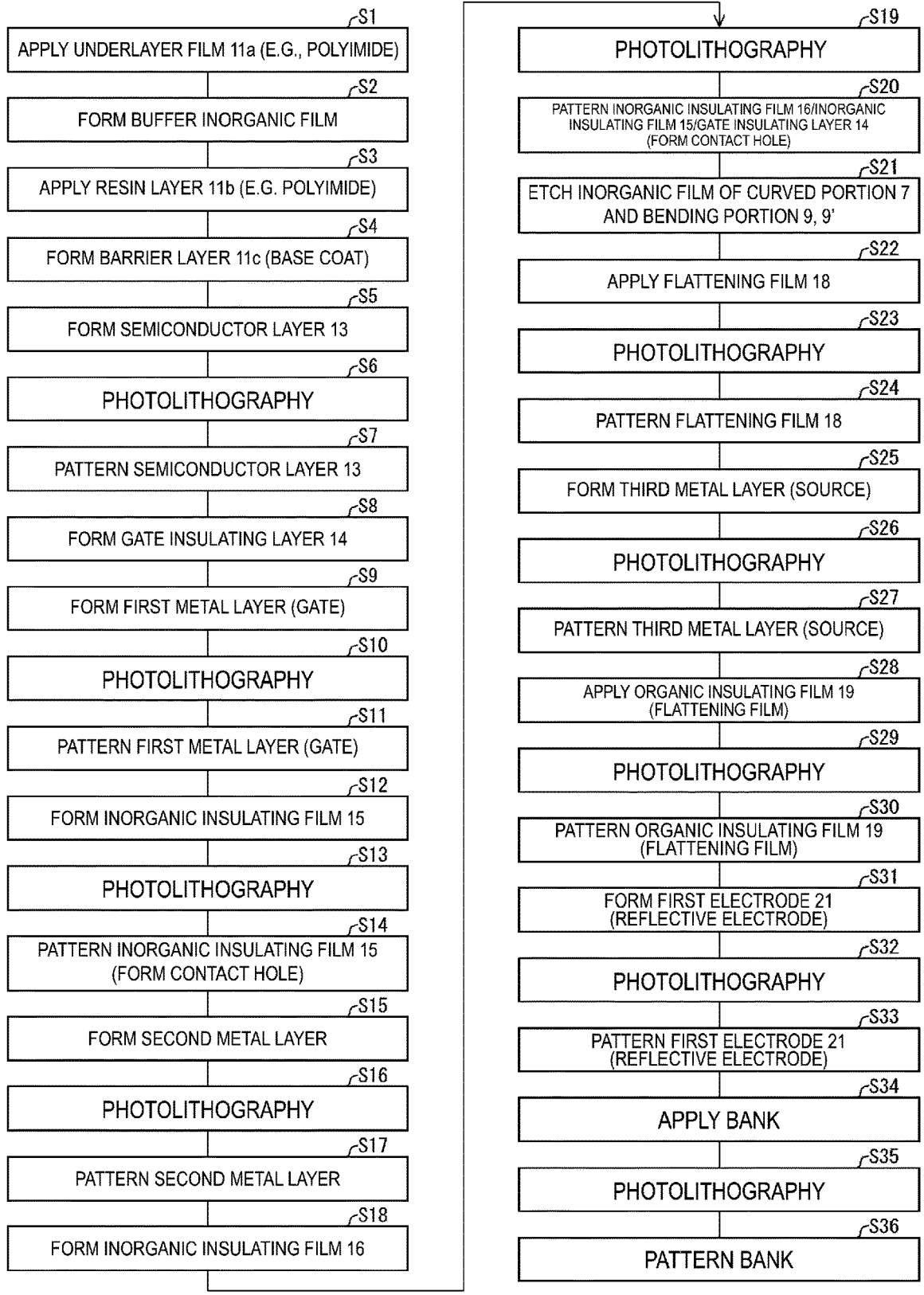
FIG. 4 is a flowchart illustrating an example of a manufacturing process of the flexible display device according to each embodiment of the disclosure.

An example of a manufacturing process of the flexible display device 1 will be described with reference to a flowchart illustrated in FIG. 4.

First, an underlayer film 11a (e.g., polyimide) is applied onto a transparent support substrate (e.g., mother glass) (step S1). Next, a buffer inorganic film (not illustrated) is formed (step S2). Next, a resin layer 11b (e.g., polyimide) is applied (step S3). Next, a barrier layer 11c (base coat) is formed (step S4).

Next, the semiconductor layer 13 is formed (step S5), photolithography is performed (step S6), and the semiconductor layer 13 is patterned (step S7).

Next, the gate insulating film 14 is formed (step S8). Next, a gate (first metal layer) is formed (step S9), photolithography is performed (step S10), and the gate is patterned (step S11).

Next, the inorganic insulating film 15 is formed (step S12), photolithography is performed (step S13), and the inorganic insulating film 15 is patterned (a contact hole is formed) (step S14).

Next, a second metal layer is formed (step S15), photolithography is performed (step S16), and the second metal layer is patterned (step S17).

Next, the inorganic insulating film 16 is formed (step S18), and photolithography is performed (step S19).

Next, the inorganic insulating film 16, the inorganic insulating film 15, and the gate insulating film 14 are patterned (a contact hole is formed) (step S20).

Next, at least one of the inorganic films (the inorganic insulating film 16, the inorganic insulating film 15, and the gate insulating film 14) formed in the curved portion 7 and the bending portion 9, 9' is etched (step S21). Then, the flattening film 18 is applied to the opening 7A and 9A formed by the etching (step S22), photolithography is performed (step S23), and the flattening film 18 is patterned (step S24). When the flattening film 18 is photosensitive, it is patterned in step S23.

Next, a third metal layer is formed (step S25), photolithography is performed (step S26), and the third metal layer is patterned (step S27).

Next, an organic insulating film 19 as a flattening film is applied (step S28), photolithography is performed (step S29), and the organic insulating film 19 is patterned (step S30). When the organic insulating film 19 is photosensitive, it is patterned in step S29.

Next, the first electrode 21 (reflective electrode) is formed (step S31), photolithography is performed (step S32), and the first electrode 21 is patterned (step S33)

Finally, a bank is formed (step S34), photolithography is performed (step S35), and the bank is patterned (step S36). When the bank is photosensitive, it is patterned in step S35.

Advantageous Effects

As described above, in the flexible display device 1 according to the present embodiment, the first high power supply voltage trunk wiring line TD, to which each of the first high-level power supply voltage lines 71A that supply a high-level potential to the pixel circuits 25 driving the OLED 24 of the display region 5 is connected, and the second high power supply voltage trunk wiring line TD', to which each of the second high-level power supply voltage lines 71A' that supply a high-level potential to the pixel circuits 25 driving OLED 24 of the display region 5' is connected, are electrically connected via the first curved portion conductive layer 27.

Consequently, according to the present embodiment, it is possible to suppress a voltage drop in the high power supply voltage that is likely to occur as it approaches the curved portion 7, and possible to reduce variations in voltage.

Modified Example of First Embodiment

Figure 5:
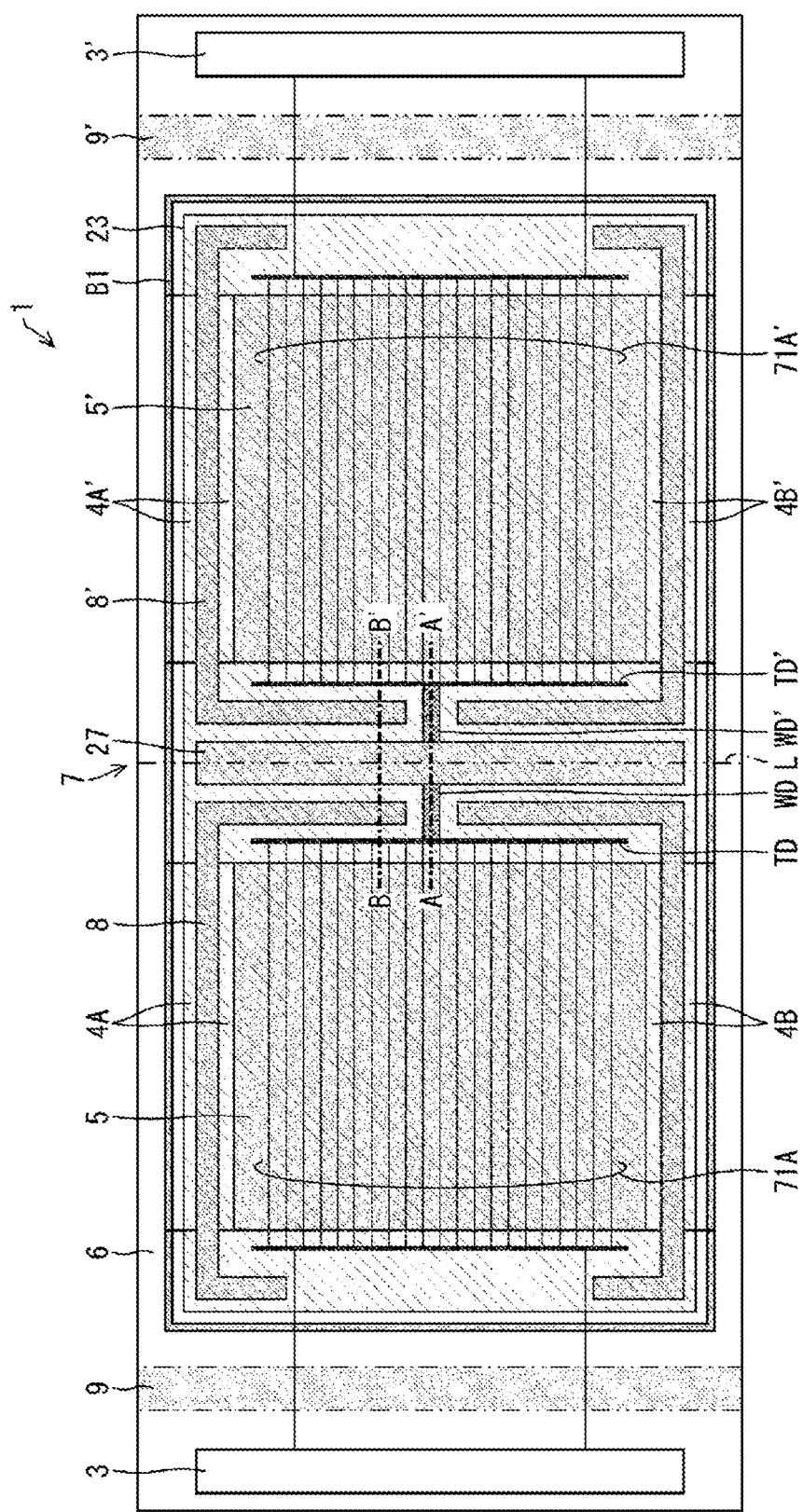
FIG. 5 is a plan view illustrating a schematic configuration of main portions of a flexible display device according to a modified example of first embodiment of the disclosure.
Figure 6:
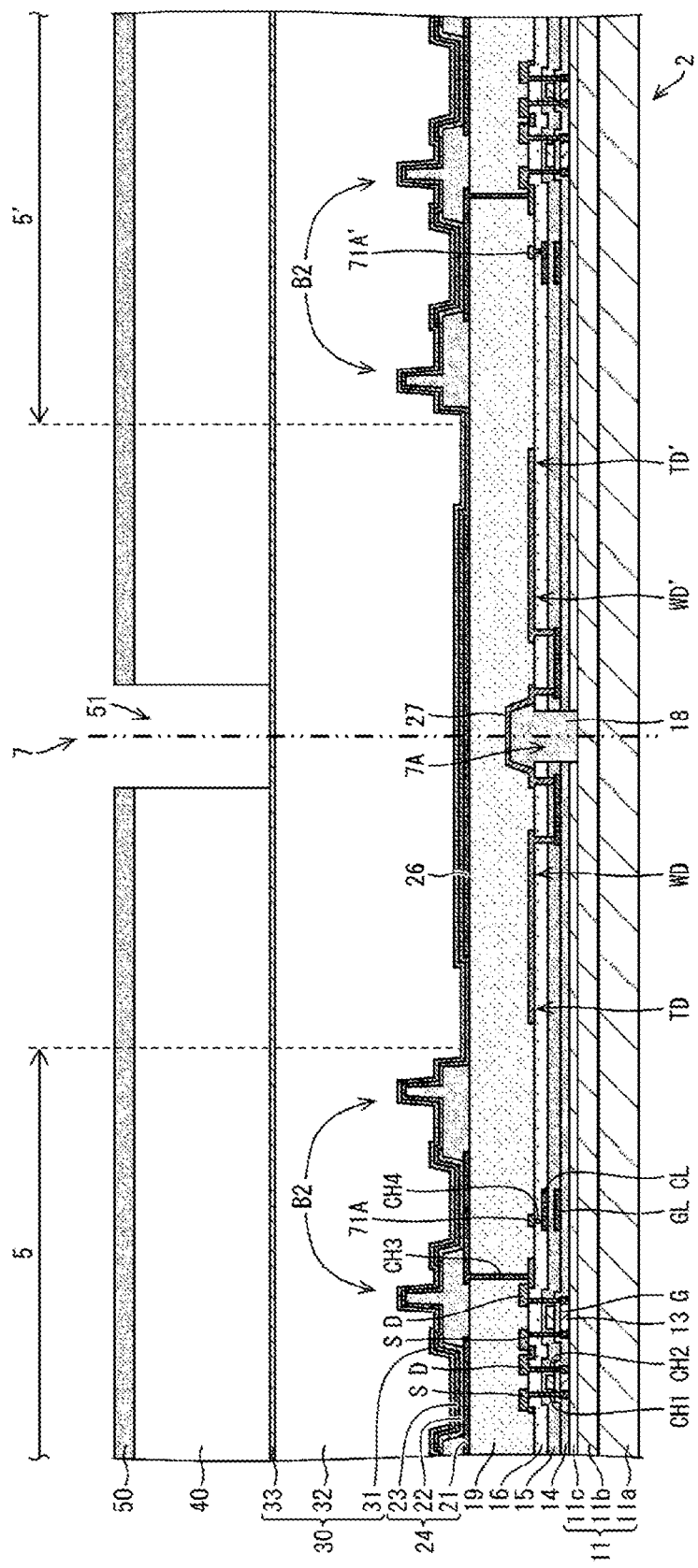
FIG. 6 is a cross-sectional view (taken along line A-A of FIG. 5) illustrating a schematic configuration at or near a curved portion of a flexible display device according to a modified example of the first embodiment of the disclosure.
Figure 7:
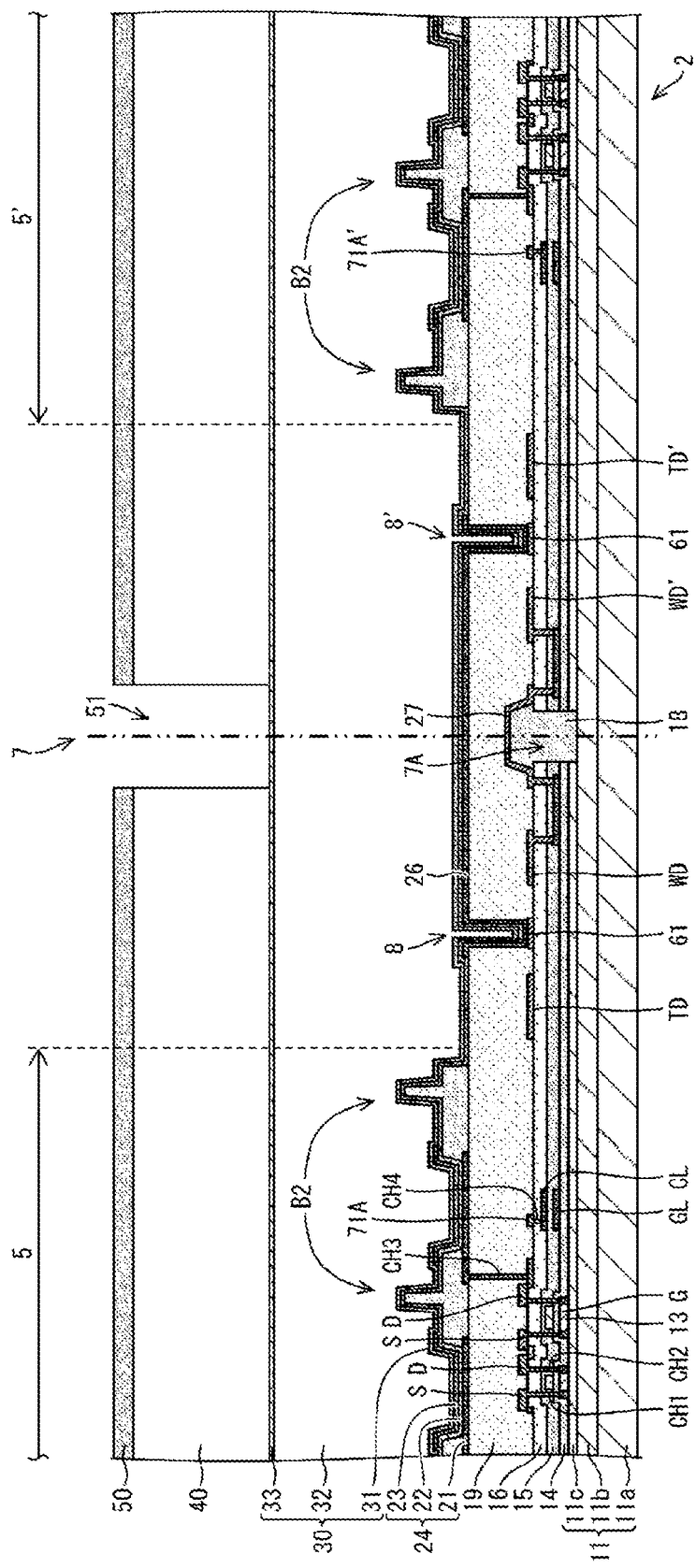
FIG. 7 is a cross-sectional view (taken along line B-B of FIG. 5) illustrating a schematic configuration at or near a curved portion of a flexible display device according to a modified example of the first embodiment of the disclosure.

FIG. 5 is a plan view illustrating a schematic configuration of main portions of a modified example of the flexible display device 1 according to the present embodiment. FIGS. 6 and 7 are cross-sectional views illustrating a schematic configuration at or near the curved portion 7 of the flexible display device 1 according to a modified example of the present embodiment. Note that FIG. 6 corresponds to a cross-sectional view taken along line A-A of the flexible display device 1 illustrated in FIG. 5. FIG. 7 corresponds to a cross-sectional view taken along line B-B of the flexible display device 1 illustrated in FIG. 5.

Differences between the flexible display device 1 according to the present modified example and the flexible display device 1 according to the first embodiment will be described below.

In the present modified example, as illustrated in FIG. 5, in a plan view, a part of the portion of the trench 8 adjacent to the curved portion 7 is divided with the first high power supply lead wiring line WD interposed therebetween. The first high power supply lead wiring line WD electrically connects the first high power supply voltage trunk wiring line TD and the first curved portion conductive layer 27, and is formed in the same layer of the same material as the first curved portion conductive layer 27.

In the region labeled "WD" illustrated in FIG. 5, the first high power supply lead wiring line WD is formed of a solid-like metal layer. However, the first high power supply lead wiring line WD is not limited to a solid-like metal layer, and at least a plurality of wiring lines that are thicker than the high-level power source lines 71A may be formed.

In the examples illustrated in FIGS. 6 and 7, the first high power supply voltage trunk wiring line TD may be formed to connect to the first curved portion conductive layer 27 via the first metal layer, but may be formed to connect to the first curved portion conductive layer 27 via the second metal layer instead of the first metal layer, or may be formed to extend to the first curved portion conductive layer 27 while remaining in the third metal layer.

Similarly, in the present modified example, as illustrated in FIG. 5, in a plan view, a part of the portion of the trench 8' adjacent to the curved portion 7 is divided with the second high power supply lead wiring line WD' interposed therebetween. The second high power supply lead wiring line WD' electrically connects the second high power supply voltage trunk wiring line TD' and the first curved portion conductive layer 27, and is formed in the same layer of the same material as the first curved portion conductive layer 27.

In the region labeled "WD'" illustrated in FIG. 5, the second high power supply lead wiring line WD' is formed of a solid-like metal layer. However, the second high power supply lead wiring line WD' is not limited to a solid-like metal layer, and at least a plurality of wiring lines that are thicker than the high-level power source lines 71A' may be formed.

Additionally, in the examples illustrated in FIGS. 6 and 7, the second high power supply voltage trunk wiring line TD' may be formed to connect to the first curved portion conductive layer 27 via the first metal layer, but may be formed to connect to the first curved portion conductive layer 27 via the second metal layer instead of the first metal layer, or may be formed to extend to the first curved portion conductive layer 27 while remaining in the third metal layer.

As in the present modified example, by forming the first high power supply lead wiring line WD and the second high power supply lead wiring line WD' in a third metal layer having low resistance, wiring resistance can be formed to be small.

Second Embodiment

Another embodiment of the disclosure will be described below with reference to FIGS. 8 to 10. In addition, in the present embodiment, differences from the first embodiment will be described, and members having the same functions as the members described in the first embodiment will be denoted by the same reference signs, and description thereof will be omitted.

Figure 8:
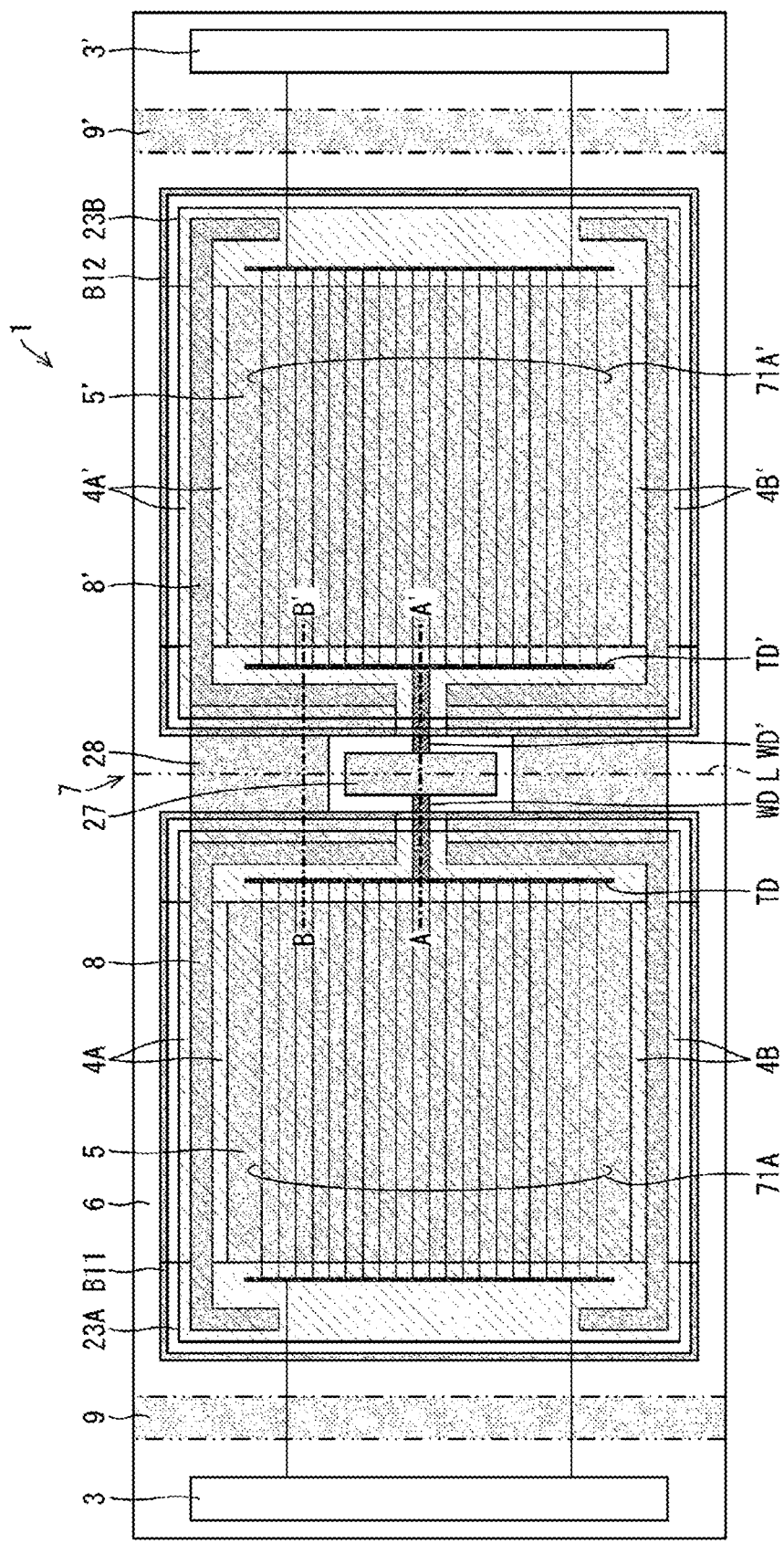
FIG. 8 is a plan view illustrating a schematic configuration of main portions of a flexible display device according to a second embodiment of the disclosure.

FIG. 8 is a plan view illustrating a schematic configuration of main portions of the flexible display device 1 according to the present embodiment. FIGS. 9 and 10 are cross-sectional views illustrating schematic configurations at or near the curved portion 7 of the flexible display device 1 according to the present embodiment. FIG. 9 corresponds to a cross-sectional view taken along line A-A of the flexible display device 1 illustrated in FIG. 8. FIG. 10 corresponds to a cross-sectional view taken along line B-B of the flexible display device 1 illustrated in FIG. 8.

Differences between the flexible display device 1 according to the present embodiment and the flexible display device 1 according to the first embodiment will be described below.

As illustrated in FIG. 8, the second electrode 23 of the flexible display device 1 of the present embodiment includes a first second electrode 23A that overlaps the display region 5 and that is a solid-like common electrode common to the pixels 90 in the display region 5, and a second second electrode 23B that overlaps the display region 5' and that is a solid-like common electrode common to the pixels 90 in the display region 5'.

In the flexible display device 1 of the present embodiment, a frame-shaped first display bank B11 surrounding the display region 5 and the trench 8 and a frame-shaped second display bank B12 surrounding the display region 5' and the trench 8' are formed. Each of the first display bank B11 and the second display bank B12 is an organic layer stopper that defines the edge of the organic layer 32 (i.e., overlaps the edge) by blocking the liquid organic material used for the organic layer 32 of the sealing film 30 (in other words, blocking the organic layer 32).

In the flexible display device 1 according to the present embodiment, similar to the first modified example of the first embodiment, a portion of the trench 8 adjacent to the curved portion 7 is divided with the first high power supply lead wiring line WD interposed therebetween, and similarly, a portion of the trench 8' adjacent to the curved portion 7 is divided with the second high power supply lead wiring line WD' interposed therebetween.

In the region labeled "WD" illustrated in FIG. 8, the first high power supply lead wiring line WD is formed of a solid-like metal layer. However, the first high power supply lead wiring line WD is not limited to a solid-like metal layer, and at least a plurality of wiring lines that are thicker than the high-level power source lines 71A may be formed. Similarly, in the region labeled "WD'" illustrated in FIG. 8, the second high power supply lead wiring line WD' is formed of a solid-like metal layer. However, the second high power supply lead wiring line WD' is not limited to a solid-like metal layer, and at least a plurality of wiring lines that are thicker than the high-level power source line 71A' may be formed.

In the trench 8, the second electrode 23A is in contact with the intermediate conductive film 26A formed of the same material in the same layer as the first electrode 21, and similarly, in the trench 8', the second electrode 23B is in contact with the intermediate conductive film 26B formed of the same material in the same layer as the first electrode 21.

Figure 10:
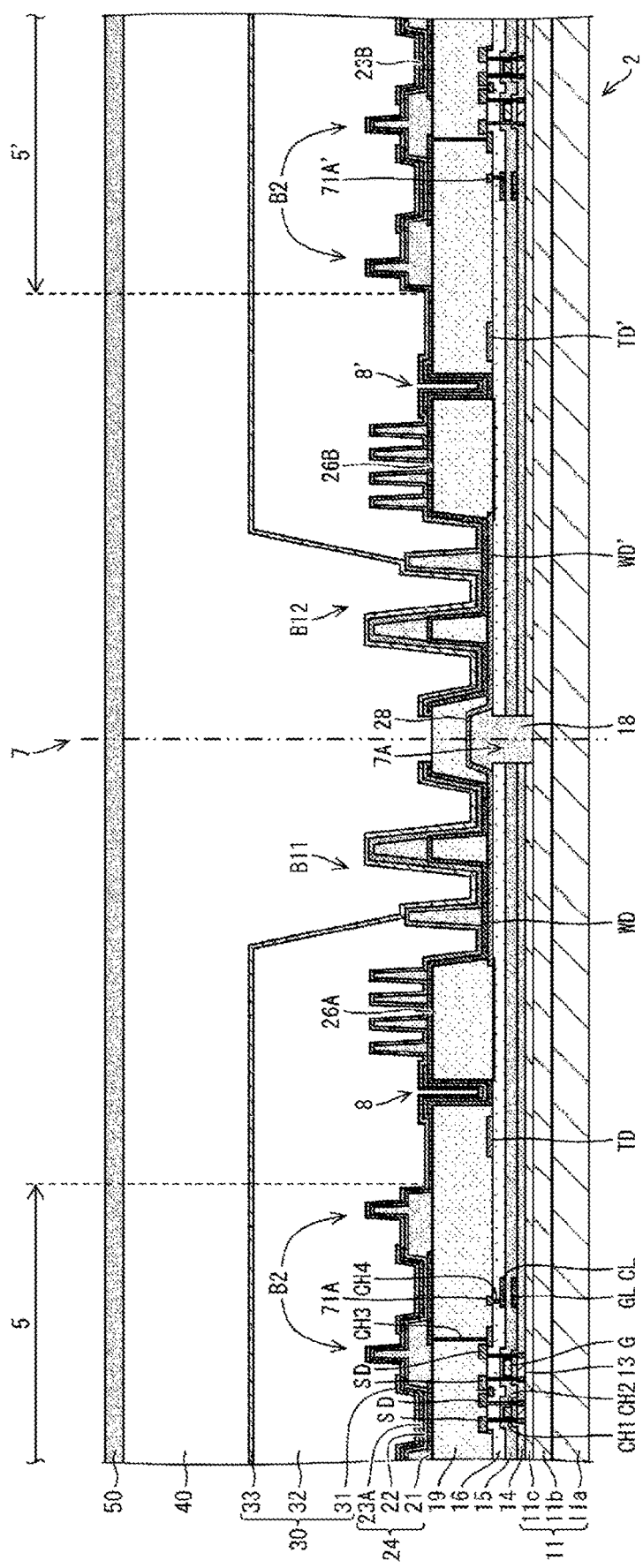
FIG. 10 is a cross-sectional view (taken along line B-B of FIG. 8) illustrating a schematic configuration at or near the curved portion of the flexible display device according to the second embodiment of the disclosure.

In the portion where the trenches 8 and 8' are not divided, as illustrated in FIG. 10, the intermediate conductive film 26A extends to the end portion of the curved portion 7 and is electrically connected to the second curved portion conductive layer 28 formed in the curved portion 7. Similarly, the intermediate conductive film 26B extends to the end portion of the curved portion 7 and is electrically connected to the second curved portion conductive layer 28. Accordingly, the first second electrode 23A and the second second electrode 23B are electrically connected to each other via the second curved portion conductive layer 28.

The second curved portion conductive layer 28 is formed of the same material in the same layer as the first curved portion conductive layer 27. The intermediate conductive films 26A and 26B are covered with the first inorganic layer 31 and the second inorganic layer 33 for protection.

Each of the intermediate conductive films 26A and 26B only needs to extend to at least the end of the curved portion 7, and does not need to extend over the entire curved portion 7. This is because it is sufficient to prevent moisture from penetrating from the end portion of the second curved portion conductive layer 28.

Figure 9:
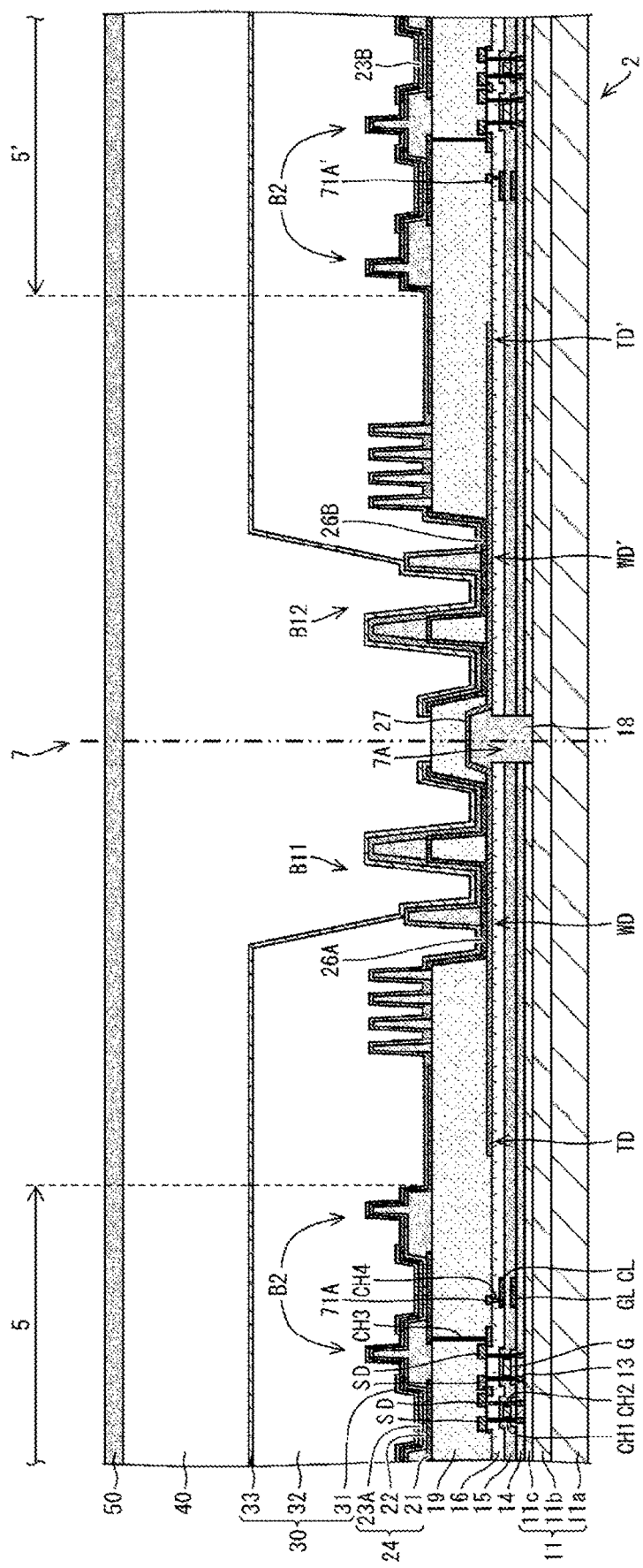
FIG. 9 is a cross-sectional view (taken along line A-A of FIG. 8) illustrating a schematic configuration at or near the curved portion of the flexible display device according to the second embodiment of the disclosure.

On the other hand, in the portion where the trenches 8 and 8' are divided, as illustrated in FIG. 9, the first high power supply lead wiring line WD and the second high power supply lead wiring line WD' are formed so as to extend toward the curved portion 7, and is connected with the first curved portion conductive layer 27.

Advantageous Effects

As described above, in the flexible display device 1 according to the present embodiment, the first high power supply lead wiring line WD and the second high power supply lead wiring line WD' are electrically connected via the first curved portion conductive layer 27 in the portion where the trenches 8 and 8' are divided. Accordingly, in the present embodiment as well, it is possible to suppress a voltage drop in the high power supply voltage, and possible to reduce variations in voltage.

First Modified Example of Second Embodiment

In the second embodiment, the first high power supply lead wiring line WD and the second high power supply lead wiring line WD' were formed so as to extend the third metal layer to the first curved portion conductive layer 27. Alternatively, the first high power supply lead wiring line WD and the second high power supply lead wiring line WD' may be formed via the contact hole through the first metal layer or the second metal layer to the first curved portion conductive layer 27.

Second Modified Example of Second Embodiment

In the example illustrated in FIG. 9, all of the lines from the curved portion conductive layer 27 to the first high power supply voltage trunk wiring line TD and from the curved portion conductive layer 27 to the second high power supply voltage trunk wiring line TD' are wired only by the third metal layer. However, in place of this, wiring may be performed via at least one of the first metal layer and the second metal layer.

Third Modified Example of Second Embodiment

In the second embodiment, the example including the first second electrode 23A common to the display region 5 and the second second electrode 23B common to the display region 5' has been described. However, instead of this, similar to the first embodiment, the second electrode 23 common to the display regions 5 and 5' may be provided so as to straddle the curved portion 7.

Fourth Modified Example of Second Embodiment

Also in second embodiment, similarly to the first embodiment, the notch portion 51 may be provided in the cover layer 50 and the adhesive layer 40 in the curved portion 7.

First Modified Example of Each Embodiment

In each of the embodiments, the flexible display device 1 is a bi-fold rectangular display device, and the display region is divided into two display regions 5 and 5' by the curved portion 7. However, each embodiment is not limited thereto. The flexible display device 1 may be a three-fold display in which two curved portions 7 are provided along the shorthand direction so as to divide each side along the longitudinal direction of the flexible display device 1 into three equal portions, so that the display region is divided into three by the curved portions 7. Further, the flexible display device 1 may be a multi-fold display having four or more folds.

Second Modified Example of Each Embodiment

In each embodiment, the flexible display device 1 including the OLED 24 has been described as an example of the display device. However, the flexible display device 1 according to each embodiment is not particularly limited as long as it is a display device including a flexible and bendable optical element. Examples of the optical element include an electro-optical element whose luminance and transmittance are controlled by a current and an electro-optical element whose luminance and transmittance are controlled by a voltage, or the like. Examples of the display panel (display device) include an EL display such as an organic EL display with OLED element and an inorganic EL display with inorganic light emitting diode element (inorganic EL element), and a QLED display with QLED (Quantum-dot Light Emitting Diode) element, or the like. The OLED element, the inorganic light emitting diode element, and the QLED element are light-emitting elements, and for example, luminance and transmittance are controlled by a current.

When the light-emitting element is a QLED, holes and electrons are recombined in the light-emitting layer by a drive current between the first electrode 21 and the second electrode 23, and light (fluorescence) is emitted in a process in which excitons, generated in the process of recombination, transition from a conduction band to a valence band of the quantum dot.

Supplement

A flexible display device 1 according to an aspect 1 of the disclosure includes: a first display region 5 and a second display region 5' each including a plurality of OLEDs 24 (optical elements), each of the plurality of optical elements including a first electrode 21 provided for each pixel 90, a second electrode 23 provided in common to a plurality of pixels 90, and a function layer sandwiched between the first electrode 21 and the second electrode 23; a curved portion 7 provided between the first display region 5 and the second display region 5'; a frame region 6 surrounding the first display region 5, the second display region 5', and the curved portion 7; a terminal portion 3, 3' provided with a terminal of a wiring line; a bending portion 9, 9' provided between the frame region 6 and the terminal portion 3, 3'; a plurality of pixel circuits 25 corresponding to the plurality of optical elements; a plurality of first high-level power supply voltage lines 71A configured to input a high power supply voltage to the plurality of pixel circuits 25 in the first display region 5; a plurality of second high-level power supply voltage lines 71A' configured to input a high power supply voltage to the plurality of pixel circuits 25 in the second display region 5'; a first high power supply voltage trunk wiring line TD provided between the first display region 5 and the second display region 5'; and a second high power supply voltage trunk wiring line TD' provided between the first display region 5 and the second display region 5'. Here, a plurality of the first high-level power supply voltage lines 71A branch from the first high power supply voltage trunk wiring line TD and extend to the first display region 5, a plurality of the second high-level power supply voltage lines 71A' branch from the second high power supply voltage trunk wiring line TD' and extend to the second display region 5', and the first high power supply voltage trunk wiring line TD and the second high power supply voltage trunk wiring line TD' are electrically connected to each other via a first curved portion conductive layer 27 formed in the curved portion 7.

In the flexible display device 1 according to an aspect 2 of the disclosure, in the aspect 1, an opening 7A is formed in at least one inorganic film forming a thin film transistor (TFT) layer 12 in the curved portion 7, a filling film is formed to fill the opening 7A, and the first curved portion conductive layer 27 may be formed on the filling film.

In the flexible display device 1 according to an aspect 3 of the disclosure, in the aspect 1 or 2, the second electrode 23 may be provided to be common to the first display region 5 and the second display region 5', and may be provided straddling the curved portion 7.

In the flexible display device 1 according to an aspect 4 of the disclosure, in any one of the aspects 1 to 3, the second electrode 23 may include a first second electrode 23A and a second second electrode 23B, the first second electrode 23A may overlap the first display region 5, the second second electrode 23B may overlap the second display region 5', and the first second electrode 23A and the second second electrode 23B may be electrically connected to each other via a second curved portion conductive layer 28 that is formed in the curved portion 7 and that is formed of the same material in the same layer as the first curved portion conductive layer 27.

In the flexible display device 1 according to an aspect 5 of the disclosure, in the aspect 2, the flattening film forming the TFT layer 12 may be provided with a first trench 8 and a second trench 8' to surround the first display region 5 and the second display region 5', and in the first trench 8 and the second trench 8', the second electrode 23 may be in contact with an intermediate conductive film 26 formed of the same material in the same layer as the first electrode 21.

In the flexible display device 1 according to an aspect 6 of the disclosure, in the aspect 5, the intermediate conductive film 26 may be provided straddling the curved portion 7.

In the flexible display device 1 according to an aspect 7 of the disclosure, in the aspect 5, the first trench 8 may overlap a high power supply lead wiring line WD that electrically connects the first high power supply voltage trunk wiring line TD and the first curved portion conductive layer 27 via an inorganic film forming the TFT layer 12.

In the flexible display device 1 according to an aspect 8 of the disclosure, in the aspect 5, the first trench 8 may be divided with a high power supply lead wiring line WD that is interposed therebetween and electrically connecting the first high power supply voltage trunk wiring line TD and the first curved portion conductive layer 27, and the high power supply lead wiring line WD may be formed of the same material in the same layer as the first curved portion conductive layer 27.

The flexible display device 1 according to an aspect 9 of the disclosure, in any one of the aspects 1 to 8, may further include a sealing film 30 configured to seal the plurality of optical elements, where the sealing film 30 may include a plurality of inorganic layers disposed to overlap each other and at least one organic layer 32 interposed between the plurality of inorganic layers.

In the flexible display device 1 according to an aspect 10 of the disclosure, in the aspect 9, a frame-shaped bank B1 overlapping an edge of the organic layer 32 may be provided straddling the curved portion 7 to surround the first display region 5 and the second display region 5'.

The flexible display device 1 according to an aspect 11 of the disclosure may include, in the aspect 9, an adhesive layer 40 provided on the sealing film 30, and a cover layer 50 provided on the adhesive layer 40 and including a function film layer, where the adhesive layer 40 and the cover layer 50 may be provided with the notch portion 51 in the curved portion 7.

In the flexible display device 1 according to an aspect 12 of the disclosure, in the aspect 9, a frame-shaped first display bank B11 overlapping an edge of the organic layer 32 may be provided to surround the first display region 5, and a frame-shaped second display bank B12 overlapping an edge of the organic layer 32 may be provided to surround the second display region 5'.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

The invention claimed is:

1. A display device comprising:
a first display region and a second display region each including a plurality of optical elements, each of the plurality of optical elements including:
a first electrode provided for each pixel;
a second electrode provided in common to a plurality of pixels; and
a function layer sandwiched between the first electrode and the second electrode;
a curved portion provided between the first display region and the second display region;
a frame region surrounding the first display region, the second display region, and the curved portion;
a terminal portion provided with a terminal of a wiring line;
a bending portion provided between the frame region and the terminal portion;
a plurality of pixel circuits corresponding to the plurality of optical elements in each of the first and second display regions;
a plurality of first high power supply voltage lines configured to input a high power supply voltage to the plurality of pixel circuits in the first display region;
a plurality of second high power supply voltage lines configured to input a high power supply voltage to the plurality of pixel circuits in the second display region;
a first high power supply voltage trunk wiring line provided between the first display region and the second display region; and
a second high power supply voltage trunk wiring line provided between the first display region and the second display region,
wherein the plurality of first high power supply voltage lines branches from the first high power supply voltage trunk wiring line and extends to the first display region,
the plurality of second high power supply voltage lines branches from the second high power supply voltage trunk wiring line and extends to the second display region,
the first high power supply voltage trunk wiring line and the second high power supply voltage trunk wiring line are electrically connected to each other via a first curved portion conductive layer formed in the curved portion,
an opening is formed in at least one inorganic film forming a thin film transistor (TFT) layer in the curved portion,
a filling film is formed to fill the opening,
the first curved portion conductive layer is formed on the filling film,
a flattening film forming the TFT layer is provided with a first trench and a second trench to surround the first display region and the second display region, and
in the first trench and the second trench, the second electrode is in contact with an intermediate conductive film formed of the same material in the same layer as the first electrode.

2. The display device according to claim 1, wherein the intermediate conductive film is provided straddling the curved portion.

3. The display device according to claim 1, wherein the first trench overlaps a high power supply lead wiring line configured to electrically connect the first high power supply voltage trunk wiring line and the first curved portion conductive layer via an inorganic film configured to form the TFT layer.

* * * * *